US010766769B2

(12) United States Patent
Bretthauer et al.

(10) Patent No.: US 10,766,769 B2
(45) Date of Patent: Sep. 8, 2020

(54) SEMICONDUCTOR ELEMENT AND METHODS FOR MANUFACTURING THE SAME (71) Applicant: Infineon Technologies AG, Neubiberg (DE)

(72) Inventors: Christian Bretthauer, Dresden (DE); Dirk Meinhold, Dresden (DE)

(73) Assignee: Infineon Technologies AG (DE)

( * ) Notice: Subject to any disclaimer, the term of this patent is extended or adjusted under 35 U.S.C. 154(b) by 257 days.

(21) Appl. No.: 15/928,275

(22) Filed: Mar. 22, 2018

(65) Prior Publication Data

US 2018/0208461 A1   Jul. 26, 2018

Related U.S. Application Data (62) Division of application No. 15/051,310, filed on Feb. 23, 2016, now Pat. No. 9,938,141.

(30) Foreign Application Priority Data

Feb. 25, 2015 (DE) .................. 10 2015 203 393

(51) Int. Cl.
*B81C 3/00* (2006.01)
*B81C 1/00* (2006.01)
*B81B 1/00* (2006.01)

(52) U.S. Cl.
CPC ...... *B81C 1/00904* (2013.01); *B81C 1/00063* (2013.01); *B81B 1/002* (2013.01); *B81B 2201/0264* (2013.01); *B81B 2207/015* (2013.01); *B81B 2207/07* (2013.01)

(58) Field of Classification Search
CPC ............ B81C 1/00904; B81C 1/00063; B81C 1/00055; B81B 2207/07; B81B 2207/015; B81B 2201/0264; B81B 1/002
See application file for complete search history.

(56) References Cited

U.S. PATENT DOCUMENTS

| 4,236,296 | A  | 12/1980 | Woolhouse et al. |
| 5,418,190 | A  | 5/1995  | Cholewa et al. |
| 5,770,474 | A  | 6/1998  | Kim |
| 5,938,612 | A  | 8/1999  | Kline-Schoder et al. |
| 6,291,317 | B1 | 9/2001  | Salatino et al. |
| 7,223,673 | B2 | 5/2007  | Wang et al. |
| 7,335,576 | B2 | 2/2008  | David et al. |
| 7,482,251 | B1 | 1/2009  | Paulsen et al. |
| 7,700,397 | B2 | 4/2010  | Leib |
| 7,939,913 | B2 | 5/2011  | Watanabe et al. |
| 8,039,312 | B1 | 10/2011 | Gunturu et al. |
| 8,952,519 | B2 | 2/2015  | Lin et al. |

(Continued)

FOREIGN PATENT DOCUMENTS

| CN | 1890789 A   | 1/2007 |
| CN | 102157492 A | 8/2011 |

(Continued)

*Primary Examiner* — Mary A Wilczewski
(74) *Attorney, Agent, or Firm* — Design IP (57) ABSTRACT

A semiconductor element includes a processed substrate arrangement including a processed semiconductor substrate and a metallization layer arrangement on a main surface of the processed semiconductor substrate. The semiconductor element further includes a passivation layer arranged at an outer border of the processed substrate arrangement.

17 Claims, 8 Drawing Sheets

(56) References Cited

U.S. PATENT DOCUMENTS

| | | | |
|---|---|---|---|
| 9,318,461 B2 | 4/2016 | Chang et al. | |
| 9,355,975 B2 | 5/2016 | Ho et al. | |
| 9,376,314 B2 * | 6/2016 | Kautzsch | B81C 1/00246 |
| 9,382,111 B2 * | 7/2016 | Kautzsch | B81C 1/00246 |
| 9,478,576 B1 | 10/2016 | Yin et al. | |
| 9,663,354 B2 * | 5/2017 | Bieselt | B81C 1/00063 |
| 10,196,261 B2 * | 2/2019 | Rothberg | B06B 1/0292 |
| 2003/0216009 A1 | 11/2003 | Matsuura et al. | |
| 2005/0026397 A1 | 2/2005 | Daubenspeck et al. | |
| 2005/0269702 A1 | 12/2005 | Otsuka | |
| 2006/0012012 A1 | 1/2006 | Wang et al. | |
| 2008/0038868 A1 * | 2/2008 | Leib | H01L 21/50 438/107 |
| 2008/0230874 A1 | 9/2008 | Yamada et al. | |
| 2008/0299708 A1 | 12/2008 | Tsutsue | |
| 2009/0014882 A1 | 1/2009 | Ito et al. | |
| 2009/0121321 A1 | 5/2009 | Miccoli et al. | |
| 2010/0109128 A1 | 5/2010 | West et al. | |
| 2011/0169159 A1 * | 7/2011 | Lin | H01L 21/481 257/692 |
| 2011/0278722 A1 | 11/2011 | Miki | |
| 2012/0241914 A1 | 9/2012 | Yook et al. | |
| 2012/0241917 A1 | 9/2012 | Ide et al. | |
| 2013/0001787 A1 | 1/2013 | Yoshizawa et al. | |
| 2013/0192078 A1 | 8/2013 | Yoshimi et al. | |
| 2013/0334626 A1 | 12/2013 | Weber | |
| 2014/0054730 A1 * | 2/2014 | Graham | B81B 3/0021 257/415 |
| 2014/0077320 A1 | 3/2014 | Chen et al. | |
| 2014/0077383 A1 | 3/2014 | Daubenspeck et al. | |
| 2014/0239455 A1 | 8/2014 | Ishii | |
| 2015/0060888 A1 | 3/2015 | Wu et al. | |
| 2015/0375998 A1 * | 12/2015 | Kautzsch | B81C 1/00246 257/254 |
| 2015/0375999 A1 * | 12/2015 | Kautzsch | B81C 1/00246 257/254 |
| 2016/0244326 A1 | 8/2016 | Bretthauer et al. | |
| 2018/0208461 A1 * | 7/2018 | Bretthauer | B81C 1/00904 |
| 2019/0002275 A1 * | 1/2019 | Chang | B81B 7/007 |

FOREIGN PATENT DOCUMENTS

| | | |
|---|---|---|
| CN | 102344112 A | 2/2012 |
| CN | 104112659 A | 10/2014 |
| CN | 104347537 A | 2/2015 |
| JP | 2007184355 A | 7/2007 |

* cited by examiner

210 (optional) — Release etching, from a surface of the metallization layer structure towards the processed semiconductor layer, for releasing the functional element by generating a notch and for generating a kerf in the metallization layer structure at the separation region

220 — Providing a processed substrate arrangement comprising a processed semiconductor substrate and a metallization layer structure on a main surface of the processed semiconductor layer structure, the metallization layer structure comprising the kerf arranged in the metallization layer structure at a separation region in the processed semiconductor substrate, the separation region defining a border between a die region of the processed substrate arrangement and at least a second region of the processed substrate arrangement

230 — Depositing a passivation layer at a kerf surface of the kerf

SEMICONDUCTOR ELEMENT AND METHODS FOR MANUFACTURING THE SAME

CROSS-REFERENCE TO RELATED APPLICATIONS

This application is a divisional of U.S. patent application Ser. No. 15/051,310, filed Feb. 23, 2016, which claims the benefit of German Patent Application No. 10 2015 203 393.7 filed Feb. 25, 2015, which are incorporated by reference as if fully set forth.

FIELD

The present disclosure relates generally to semiconductor elements and to methods for manufacturing the same, and, more particularly, to a dual use of microelectromechanical system (MEMS) release etch and passivation.

BACKGROUND

The term microelectromechanical system (MEMS) is often used to refer to small integrated devices or systems that combine electrical and mechanical components.

MEMS may be used as, for example, actuators, transducers or sensors, e.g., pressure sensors, loudspeakers or microphones. Pressure sensors are nowadays mass products in automobile electronics and consumer goods electronics. Many of these applications systems are used in which the sensor is integrated in an application-specific integrated circuit (ASIC). In particular, MEMS are manufactured in high numbers on a wafer at a time. The processing includes separation of the MEMS from each other.

SUMMARY

Exemplary embodiments provide a method in which a processed substrate arrangement including a processed semiconductor substrate and a metallization layer structure on a main surface of the processed semiconductor substrate is provided. Release etching is performed from a surface of the metallization layer structure towards the processed semiconductor substrate, for generating a kerf in the metallization layer structure at a separation region in the processed semiconductor substrate, the separation region defining a border between a die region of the processed substrate arrangement and at least a second region of the processed substrate arrangement. The release etching can also be optionally used to release a functional element which is arranged at the processed semiconductor substrate.

Further exemplary embodiments provide a method in which a processed substrate arrangement is provided. The processed substrate arrangement includes a processed semiconductor substrate and a metallization layer structure on a main surface of the processed semiconductor substrate structure, the metallization layer structure including a kerf, the kerf being arranged in the metallization layer structure at a separation region in the processed semiconductor substrate, the separation region defining a border between a die region of the processed substrate arrangement and at least a second region of the processed substrate arrangement.

Optionally, the metallization layer structure may further include an optional notch, the notch releasing an optional functional element which is arranged at the processed semiconductor substrate.

The method further includes depositing a passivation layer (e.g., an insulator layer) at a first surface (e.g., a notch surface) of the optional notch and at a second surface (e.g., a kerf surface) of the kerf.

Further exemplary embodiments provide a semiconductor element including a processed substrate arrangement including a processed semiconductor substrate and a metallization layer arrangement. The semiconductor element further includes a passivation layer arranged at an outer border of the processed substrate arrangement. The semiconductor element may further include an optional functional element arranged at the processed semiconductor substrate.

By a double use of etching steps or passivation steps, performance of the separation may be increased such that a wafer yield (i.e., MEMS per wafer) may be high and such that mechanical defects of the MEMS due to the separation may be low.

BRIEF DESCRIPTION OF THE DRAWINGS

Exemplary embodiments are described herein making reference to the appended drawings.

DETAILED DESCRIPTION

Before exemplary embodiments are described in detail referring to the accompanying figures, it is to be pointed out that the same or functionally equal elements are given the same reference numbers in the figures and that a repeated description for elements provided with the same or similar reference numbers is typically omitted. Hence, descriptions provided for elements having the same reference numbers are mutually exchangeable and applicable.

Microelectromechanical system (MEMS) may be manufactured in silicon technology. MEMS may be configured for operating as sensors, actuators and/or transducers and may optionally comprise at least one functional element such as a membrane, a temperature element or other components to be connected with a physical, chemical and/or electrical influence (e.g., media). For example, a pressure sensor may comprise a membrane to be connected with a media in which the pressure shall be measured. Microphones or loudspeakers may comprise a membrane to sense or excite sound waves. Alternatively or in addition, a temperature probe may be exposed and connected to a media in which the temperature shall be measured.

Some MEMS including such a functional element may be arranged or attached at a semiconductor substrate. For example, the semiconductor substrate may be a locally doped or undoped silicon substrate but may also comprise other materials such as gallium arsenide (GaAs). For operating the MEMS and thereby the functional element a metallization layer structure may be arranged at the processed semiconductor substrate to obtain, receive and/or process electrical signals to or from the functional element, i.e., to operate the functional element.

For example, the optional functional element may be arranged or generated at the semiconductor substrate during processing. Other electrical and/or mechanical components may be processed to or at the semiconductor substrate to obtain a processed semiconductor substrate. The processed semiconductor substrate may be covered by a plurality of layers comprising semiconductor materials, insulator materials and/or metal materials.

Processing the semiconductor substrate and/or arranging the metallization layer structure may be denoted as back end of line (BEOL) process. The BEOL process may be performed, for example, after a front end of line (FEOL) process has been performed during which the semiconductor substrate may be patterned, for example, to obtain devices or elements such as transistors, capacitors, resistors or the like in the semiconductor substrate.

Usually, a plurality of semiconductor elements is manufactured or fabricated simultaneously at a wafer. After manufacturing or fabricating the plurality of semiconductor elements (chips) the semiconductor elements are separated from each other which is also referred as forming dies (dicing). Dicing may be performed, for example, by etching, cutting and/or breaking (cracking) the wafer into parts to separate (singularize) the single components.

Breaking the wafer may lead to cracks in BEOL layers which may lead to rejections during production, a shortened lifetime of the product or operational drifts due to media affecting the optional functional element through the cracks.

Figure 1:
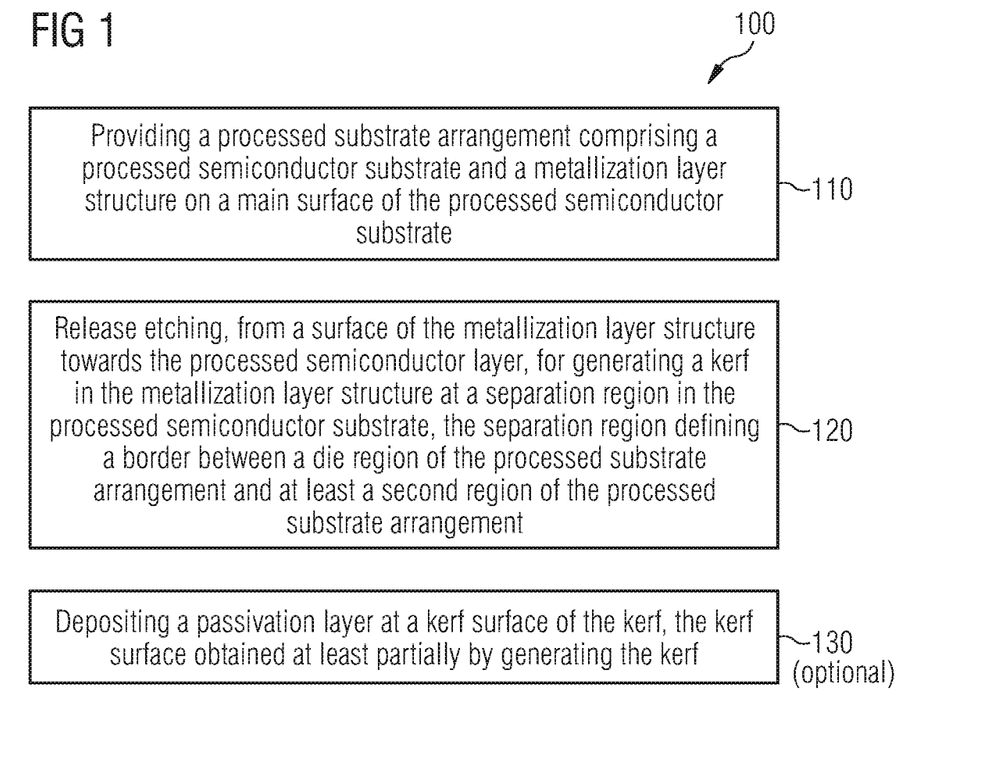
FIG. 1 shows a schematic flow chart of a method which may be used for fabricating or manufacturing a semiconductor element, according to one or more exemplary embodiments.

FIG. 1 illustrates a schematic flow chart of a method 100 which may be used for fabricating or manufacturing a semiconductor element.

The method 100 comprises providing a processed substrate arrangement at a step 110 of the method 100. The processed semiconductor substrate comprises a processed semiconductor substrate and a metallization layer structure on a main surface of the processed semiconductor substrate. The metallization layer structure may comprise a plurality of layers wherein one or more of those layers may comprise a metal material such as gold, platinum, copper, silver, tungsten, aluminum, other materials and/or a combination thereof. The metallization layer structure may be arranged at the main surface of the processed semiconductor substrate, for example, during a BEOL process.

The method 100 further comprises a step 120 comprising a release etching. The release etching may be performed from a surface of the metallization layer structure towards the processed semiconductor substrate such that a kerf is generated in the metallization layer structure at a separation region in the processed semiconductor substrate. The separation region may define a border between a die region of the processed substrate arrangement and at least a second region (e.g., other chip regions or the like) of the processed substrate arrangement.

Further, the release etching may be also performed from the surface of the metallization layer structure towards the processed semiconductor substrate such that an optional functional element which is arranged at the processed semiconductor substrate is released (uncovered or exposed).

The release etching may be performed, for example, by a dry or wet etch process which is configured for selectively removing the metallization layer structure at a region of an optional notch (trench) etched towards the optional functional element and at a region of the kerf. The kerf may be arranged such that it overlaps partially or essentially with the separation region. The separation region may be, for example, a predetermined breaking line, a predetermined saw line or a predetermined etching line at which the die region may be separated in later steps. The kerf may thus be denoted as a dicing street referring to a street-like structure (kerf) in the metallization layer structure. Simplified, by forming the kerf, the metallization layer structure is removed at least partially in the separation region. To summarize, the release etching may be a BEOL etching step for releasing the dicing streets of the wafer so that the realization of the following dicing step can be facilitated.

The optional notch and the kerf may be formed by a trench forming processes, such as by a dry etching process, a wet etching process or by a physical or a chemical etching processes. Thus, both, the kerf and the optional notch may also be referred to as a trench but are denoted as kerf and notch for the sake of clarity.

The method 100 further comprises an optional step 130. The step 130 comprises depositing a passivation layer at a first surface (notch surface) of the optional notch (releasing the optional functional element) in the metallization layer structure and at a second surface (kerf surface) of the kerf. The first surface may be obtained at least partially during the release etching for releasing the functional element, i.e., when forming the notch. The second surface may be obtained, for example, at least partially by generating the kerf. The first surface and the second surface to be obtained at least partially may be understood as there may be additional steps between the step 120 and the step 130, for example, for increasing (enlarging) the notch or the kerf such that a position and/or a size of the surfaces in the metallization layer structure and/or at the processed semiconductor substrate may be modified by this additional step. The passivation layer may be deposited at the first and second surface obtained after the step 120 or after the additional steps. The first surface may comprise one or more side wall structures of the notch in the metallization layer structure and/or a surface of the functional element, the surface defined by the notch. The second surface may comprise one or more side wall structures of the kerf in the metallization layer structure and/or a (bottom) surface thereof or of the processed semiconductor substrate. The release etching may be used for obtaining the kerf.

Optionally, the notch and the kerf may be etched during the release etching 120, simultaneously. Simplified, the release etching which may be used for releasing the functional element may be double-used for obtaining the kerf. The double use of the release etching allows for a high process performance with low or no additional amount in time or costs.

The kerf allows for increased performance during separation of the die as the metallization layer structure (arrangement) is removed at the separation region such that the metallization layer structure is prevented from taking damage (e.g., cracks) during sawing or breaking the processed semiconductor substrate.

Figure 2:
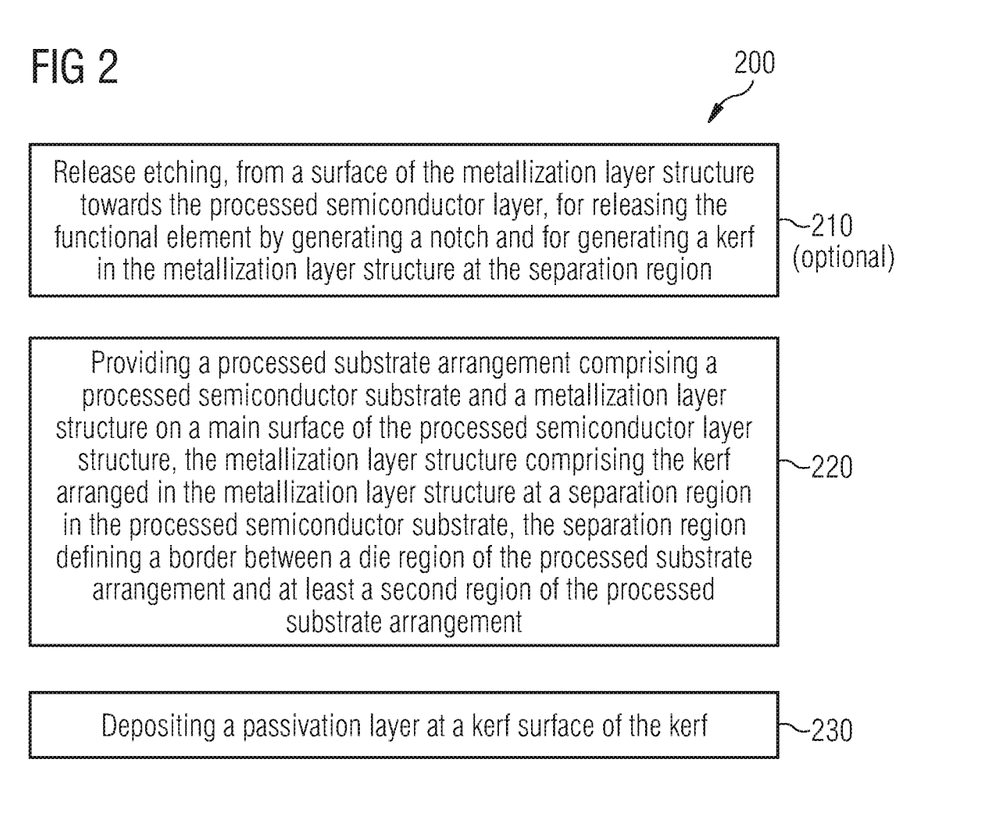
FIG. 2 shows a schematic flow diagram of a further method which may be used, for example, for fabricating or manufacturing a semiconductor element, according to one or more exemplary embodiments.

FIG. 2 shows a schematic flow diagram of a method 200 which may be used, for example, for fabricating or manufacturing a semiconductor element. The method 200 comprises an optional step 210. The step 210 comprises an etching (e.g., a release etching) from a surface of the metallization layer structure towards the processed semiconductor substrate for generating a kerf in the metallization layer structure at the separation region. The step 210 may also comprises an etching from a surface of the metallization layer structure towards the processed semiconductor substrate, for releasing the optional functional element by generating the notch in the metallization layer structure. The step 210 may be equal or essentially equal when compared to the step 120.

The method 220 comprises a step 220 comprising providing a processed substrate arrangement. The processed substrate arrangement comprises a processed semiconductor substrate and a metallization layer structure on a main surface of the processed semiconductor substrate, the metallization layer structure. The metallization layer structure may comprise an optional notch and a kerf, the optional notch releasing an optional functional element which is arranged at the processed semiconductor substrate. The kerf is arranged in the metallization layer structure at a separation region in the processed semiconductor substrate. The notch and/or the kerf may be obtained, for example, by the step 210 or other processes. The separation region may define a border between a die region of the process substrate arrangement and at least a second region of the processed substrate arrangement. For example, the step 220 may comprise providing an etched and processed semiconductor substrate obtained when performing step 120 or step 210.

The method 200 comprises a step 230 in which a passivation layer is deposited at a first surface (e.g., a notch surface) of the notch and at a second surface (e.g., a kerf surface) of the kerf. The step 230 may be equal or essentially equal when compared to the step 130.

The passivation layer may comprise a passivation or seal ring material such as silicon oxide, silicon nitride or other materials. By passivating the surfaces of the notch and the kerf, a passivation of the metallization layer structure and, in particular, a protection of the layers thereof may be obtained. Further, short circuits or the like between layers of the metallization layer structure may be prevented. Alternatively or in addition, the passivation layer arranged at the surface of the kerf allows for a high protection of the device during separation of the die from further regions of the wafer (processed substrate arrangement). The kerf may define at least partially a separation pathway (e.g., a breaking line) of the metallization layer structure when the processed semiconductor substrate is separated, e.g., sawn or broken.

The kerf and the notch may be the kerf and the notch obtained when performing or executing method 100. Thus, the kerf may allow for a simplified separation of the dies and may alternatively or in addition allow for a reduced and/or controlled distribution or propagation of cracks due to the separation. In particular, the kerf may hamper the propagation of cracks when breaking, separating or dicing the processed semiconductor substrate. Simplified, by providing the kerf in the metallization layer structure and aligned with a separation region (dicing street) of the processed semiconductor substrate, cracks that propagate through the material (e.g., the BEOL material) based on the separation (e.g., dicing) may be avoided or at least reduced. Additionally, the protection of the metallization layer structure obtained by the passivation layer may include but is not limited to a high resistivity against aggressive chemical media. Aggressive or corrosive media may be, for example, acids or bases and/or methane based materials, for example, diiodmethane.

For example, a robustness of silicon nitride used as a material for the passivation layer may be increased when compared to an arrangement of seal rings around the die, when the semiconductor element is configured for being exposed to diiodmethane. Diiodmethane may corrode metal based seal rings, wherein silicon nitride is less or not affected by such a media. Thus, a robustness and, therefore, a lifetime and an accuracy of the semiconductor element may be high. A passivation of surfaces of the notch may be performed sequentially but also simultaneously, i.e., during the passivation step. Such a double-use of the passivation step may allow for a high robustness of the with low or no additional amount in time or costs Steps of the methods 100 and 200 may be combined and/or mutually exchanged with each other. In particular, method 100 may comprise a step in which the passivation layer is arranged and/or method 200 may comprise a step in which the kerf is generated.

Figure 3:
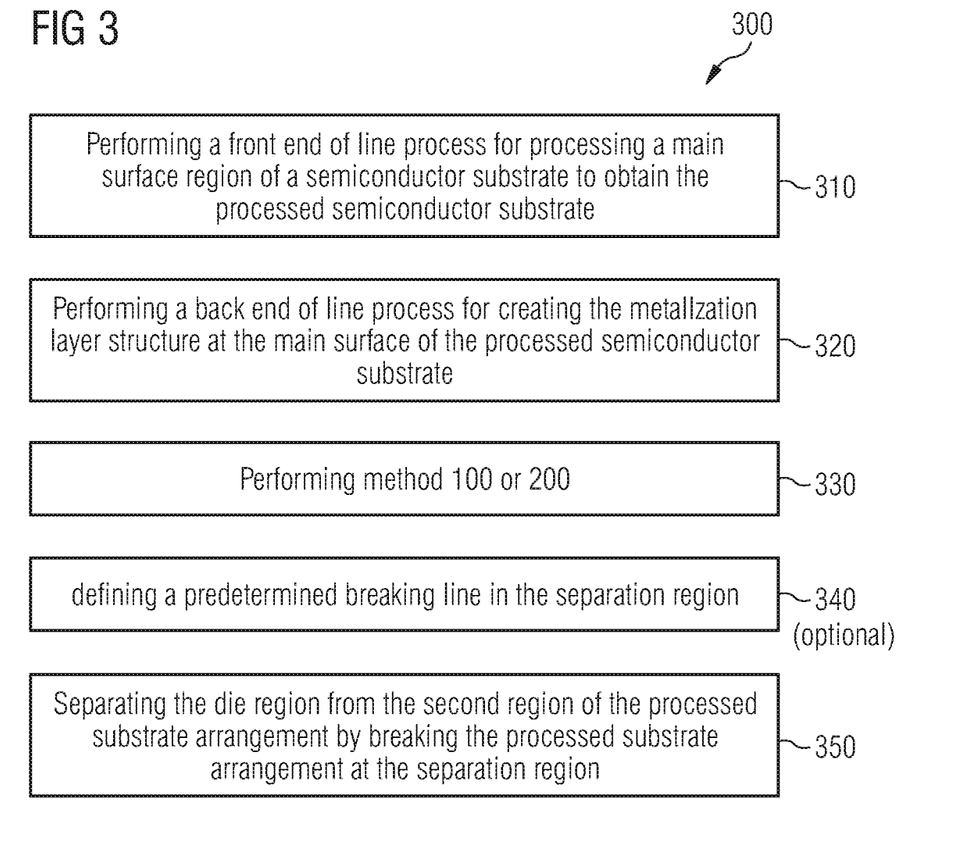
FIG. 3 shows a schematic flow chart of a method for manufacturing a semiconductor element comprising steps of the method described in FIG. 1 and/or FIG. 2, according to one or more exemplary embodiments.

FIG. 3 shows a schematic flow chart of a method 300 for manufacturing a semiconductor element. The method 300 comprises an optional step 340 in which a predetermined breaking line is defined in the separation region. For example, a processed or unprocessed wafer may be provided. Between regions of the wafer, at which a functionality of the semiconductor element will be implemented (processed) at least partially during later steps, the separation region may be implemented by defining borders between different die areas. This may comprise, for example, an etching process for removing material of the wafer in the separation region to obtain a predetermined breaking line in the separation region. A predetermined breaking line may allow for a precise breaking (separation) of the later dies.

Alternatively, a so-called stealth dicing process may be performed for implementing the predetermined breaking line in the separation region. During a stealth dicing process a laser may be used to cut a semiconductor material, for example, the wafer, into pieces (die regions) by internal processing. The stealth dicing process may involve utilization of a laser beam at a wavelength permeable to the semiconductor material. The laser may be focused through an objective lens onto a point within the semiconductor layer. The laser beam may be guided to scan along a dicing line (predetermined breaking line) and/or along the separation region. An optical system used may allow for a high focusing performance capable of condensing light to the diffraction limit and so the high-repetition, short pulsed laser beam may temporally and spatially condense to an extremely localized region in the vicinity of the focal point to deliver a high peak power density. The laser beam permeable to the semiconductor substrate may begin to exhibit high absorption in a localized point when the peak power density exceeds a certain threshold in the light condensing process. The optical system and laser characteristics may allow for controlling this threshold so as to exceed just near the focal point within the semiconductor wafer. The laser beam may selectively machine only certain localized points without damaging the surface and rear sides of the semiconductor substrate. Simplified, a buried (i.e., hidden or stealth) predetermined breaking line may be obtained in the semiconductor substrate. The predetermined breaking line may be obtained, by applying a laser beam from a first main surface (e.g., a front side) and/or from a second main surface (e.g., a back side) of the semiconductor substrate.

Processing the predetermined breaking line, e.g., by performing the step 340, may allow for a reduced an amount of damage and/or cracks when compared to a separation process during which the dies are separated by breaking and during which the breaking is performed at the kerf without such a pre-processing.

The method 300 comprises a step 310 during which a front end of a line process is performed for processing a main surface region of a semiconductor substrate to obtain the processed semiconductor substrate.

At a step 320 of the method 300, a back end of a line process is performed for creating the metallization layer structure at the main surface of the processed semiconductor substrate.

The method 100 or the method 200 is performed at a step 330 of the method 300.

At a step 350 of the method 300 the die region is separated from the second region (e.g., other dies) of the processed substrate arrangement by breaking the processed substrate arrangement at the separation region. Performance of the step 350 may be high when the step 340 is performed before the step 350, for example, after the step 330. The step 340 may also be performed before the step 310 or 320 is performed, for example, when a region of the processed semiconductor substrate may be processed (e.g., when the region is uncovered). For example, the laser beam may be guided through the kerf after the kerf has been provided or etched.

Figure 4A:
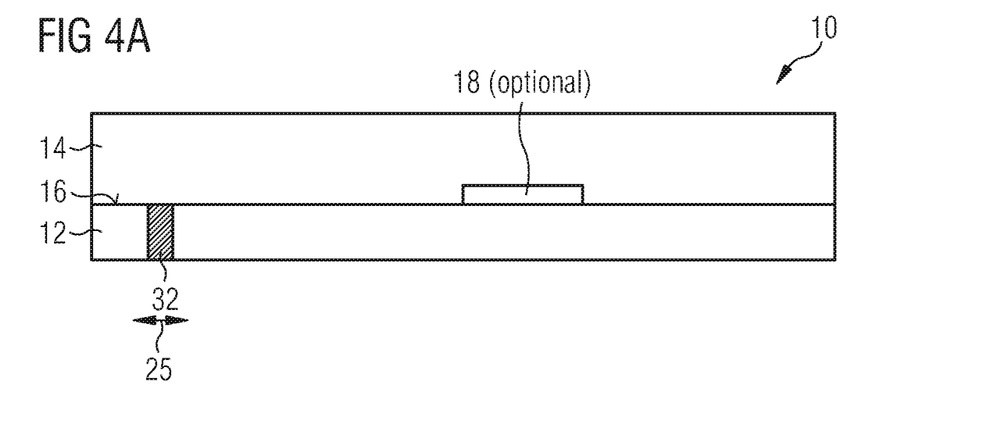
FIG. 4a shows a schematic cross-sectional view of a processed substrate arrangement, according to one or more exemplary embodiments.

FIG. 4a shows a schematic cross-sectional view of a processed substrate arrangement 10 comprising a processed semiconductor substrate 12 and a metallization layer structure 14 which is arranged on a main surface 16 of the processed semiconductor substrate 12. The main surface may be, for example, a side of the wafer comprising a high or even the highest area size. For example but without limitation, this may be a front or a back side of a wafer having a cylindrical shape, wherein a lateral surface is arranged between both main surfaces (i.e., the front side and the back side). The main surface 16 may be the surface comprising structures processed into the processed semiconductor substrate 12, for example, transistors, resistors and/or capacitors.

A functional element 18 is optionally arranged at the processed semiconductor substrate 12. The processed substrate arrangement 10 may be, for example, provided in the step 110. The processed semiconductor substrate 12 may comprise the predefined breaking line 32, for example, in a separation region 25 and may be obtained when performing the step 340.

Figure 4B:
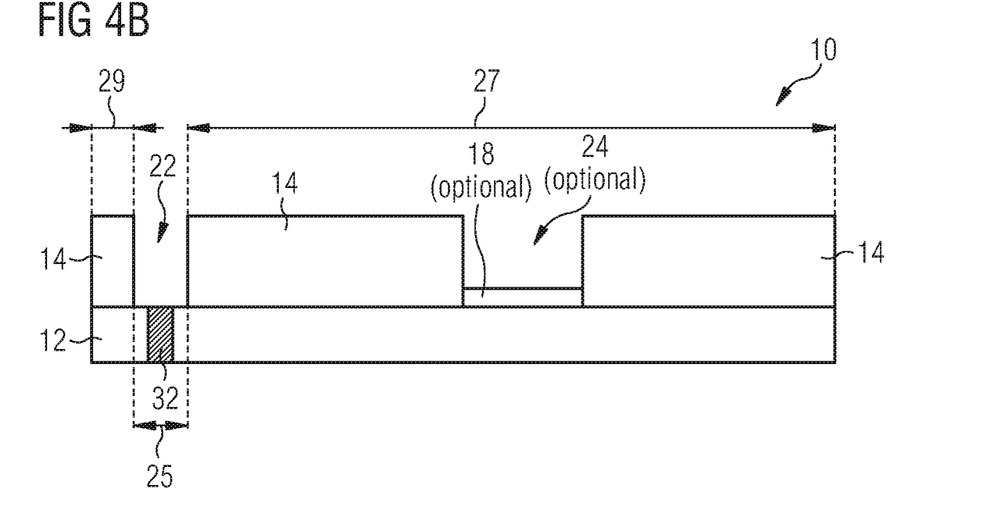
FIG. 4b shows a schematic cross-sectional view of the processed substrate arrangement of FIG. 4a including a kerf and a notch formed in the processed substrate arrangement, according to one or more exemplary embodiments.

FIG. 4b shows a schematic cross-sectional view of the processed substrate arrangement 10, wherein, when compared to the processed substrate arrangement 10 shown in FIG. 4a, a kerf 22 and an optional notch 24 are formed in the processed substrate arrangement 10 and at the separation region 25, for example, by performing the step 120 or 210. The separation region 25 may surround a die region 27 and form a border between the die region 27 and other parts or regions 29 of the processed substrate arrangement 10.

The optional functional element 18 is released from the metallization layer structure 14 at least at a (e.g., top) side and with respect to a surrounding media of the processed substrate arrangement 10, i.e., the optional functional element 18 may be contacted with the media. Alternatively, the notch may leave the functional element at least partially covered.

Although the kerf 22 is depicted as being etched through the complete metallization layer structure 14 (i.e., extending to the processed semiconductor substrate 12), the kerf 22 may be formed such that one or more of the metallization layer structure 14 remains at or in the kerf 22. Alternatively, the kerf 22 may be formed such that the kerf 22 extends into the semiconductor substrate 12.

Figure 4C:
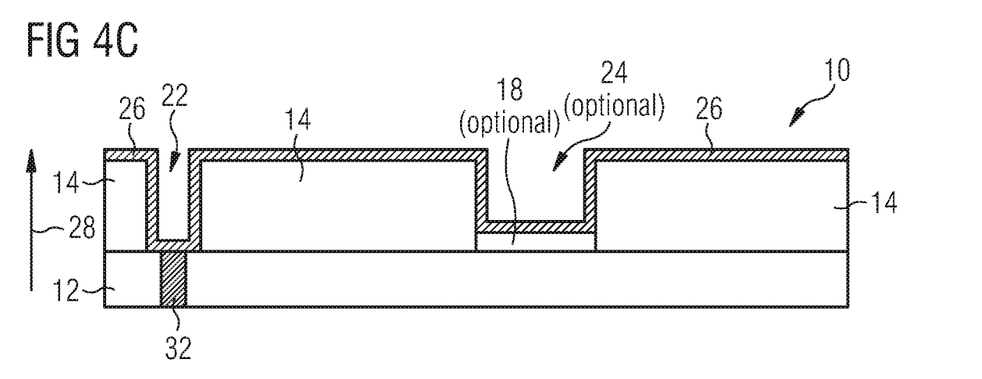
FIG. 4c shows a schematic cross-sectional view of the processed substrate arrangement after a passivation layer is arranged at the notch and the kerf, according to one or more exemplary embodiments.

FIG. 4c shows a schematic cross-sectional view of the processed substrate arrangement 10 after a passivation layer 26 is arranged at the optional notch 24 and the kerf 22. The passivation layer 26 may cover (i.e., be arranged at) a surface of the metallization layer structure 14 defined (i.e., opened) by the kerf 22 and/or the optional notch 24. The passivation layer 26 may additionally cover a bottom of the kerf 22 and/or of the optional notch 24. The bottom (wherein bottom shall only be understood as an end of the kerf in the processed semiconductor substrate) of the kerf 22 may be the processed semiconductor substrate 12 or a layer of the metallization layer structure 14. For example, when a depth of the kerf 22 is lower than a thickness of the metallization layer structure 14 along a thickness direction 28, one or more layers of the metallization layer structure may remain in the separation region. The thickness direction 28 may be parallel to a surface normal of the processed semiconductor substrate 12. The passivation layer 26 may be arranged at almost all or all of the surfaces of the processed substrate arrangement 10 such that the passivation layer is arranged at the kerf 22, at the notch 24 and at least partially on other surfaces of the processed substrate arrangement. Alternatively, the passivation layer 26 may be arranged selectively, for example, at side wall structures of the kerf 22 and/or of the notch 24, wherein parts of the remaining surface(s) of the processed substrate arrangement may remain uncovered by the passivation layer 26.

A thickness of the processed substrate arrangement may be, for example, at least 5 µm and at most 1000 µm, at least 10 µm and at most 400 µm or at least 20 µm and at most 300 µm. A thickness of the processed semiconductor substrate may be, for example, at least 2 µm and at most 1000 µm, at least 5 µm and at most 800 µm or at least 100 µm and at most 500, for example between 200 µm and 300 µm. A thickness of the metallization layer structure (BEOL) may be, for example, at least 100 nm and at most 100 µm, at least 1 µm and at most 10 µm or at least 4 µm and at most 6 µm such as 5 µm. The breaking line may comprise a lateral extension, for example, of at least 1 µm and at most 200 µm, of at least 5 µm and at most 100 µm or of at least 10 µm and at most 60 µm. Thus, the breaking line 32 may comprise a larger lateral extension along a direction perpendicular to the thickness direction 28 when compared to a lateral extension of the kerf 22 along the same direction.

Although the passivation layer 26 is depicted as being arranged at or on the optional functional element 18, the functional element 18 may remain uncovered from the passivation layer 26. Alternatively, the passivation layer may, for example, be removed in a subsequent processing step.

Although the passivation layer 26 is depicted as covering the processed semiconductor substrate 12 in the kerf 22, the processed semiconductor substrate 12 may remain uncovered by the passivation layer 26 in the kerf 22. Alternatively, the passivation layer may, for example, be removed in a subsequent processing step. Simplified, at least the side walls (side wall structure) of the kerf 22 and of the optional notch 24 are covered by the passivation layer 26.

The processed semiconductor substrate 12 comprises, for example, the predefined breaking line 32 which may be obtained when performing the step 340. Although the processed semiconductor substrate 12 is described as comprising the breaking line 32 before forming the kerf 22 and the notch 24, the breaking line 32 may also be obtained during a process performed before separating the die region 27 from other regions 29. For example, first the kerf 22 may be formed and then the step 340 may be performed, e.g., by stealth dicing. The predefined breaking line 32 may be arranged in the separation region 25 and in the processed semiconductor substrate 12 before arranging the passivation layer 26, for example, after etching the kerf 22 and/or before arranging or providing the processed substrate arrangement 10. Simplified, the processed substrate arrangement 10 depicted in FIG. 4a or FIG. 4b may be implemented without comprising the predefined breaking line 32.

The kerf 22 may comprise a width along a lateral direction perpendicular to the thickness direction 28 of at most 100 µm, of at most 50 µm or at most 30 µm. For example, the kerf may comprise a width of 16 µm (e.g., between 10 and 20 µm). Then, the passivation layer 26 is arranged subsequently, wherein the passivation layer 26 may comprise a thickness between 10 to 200 nm, between 20 to 100 or between 40 to 60 nm and may comprise a thickness of about 50 nm. The passivation layer 26 may comprise other extensions along the thickness direction 28, for example, at least 1 nm, at least 1 µm or at least 50 µm. The notch 24 may comprise a width along the direction perpendicular to the thickness direction 28, which is dependent from an extension of the functional element 18 along that direction and may be, for example, between 10 µm and 2000 µm, between 20 µm and 1000 µm or between 30 µm and 800 µm. For example, when viewed observed from a direction perpendicular to the side view (e.g., a top or bottom view), the notch may comprise an extension of 30×500 µm². Adjacent to the notch 28, for example, between the notch 28 and the kerf 22 stress decoupling trenches may be arranged. The stress decoupling trenches may comprise a width along the lateral direction perpendicular to the thickness direction 28 which may be, for example, at least 1 µm and at most 100 µm, at least 3 µm and at most 50 µm or at least 5 µm and at most 10 µm such as about 8 µm.

Figure 5:
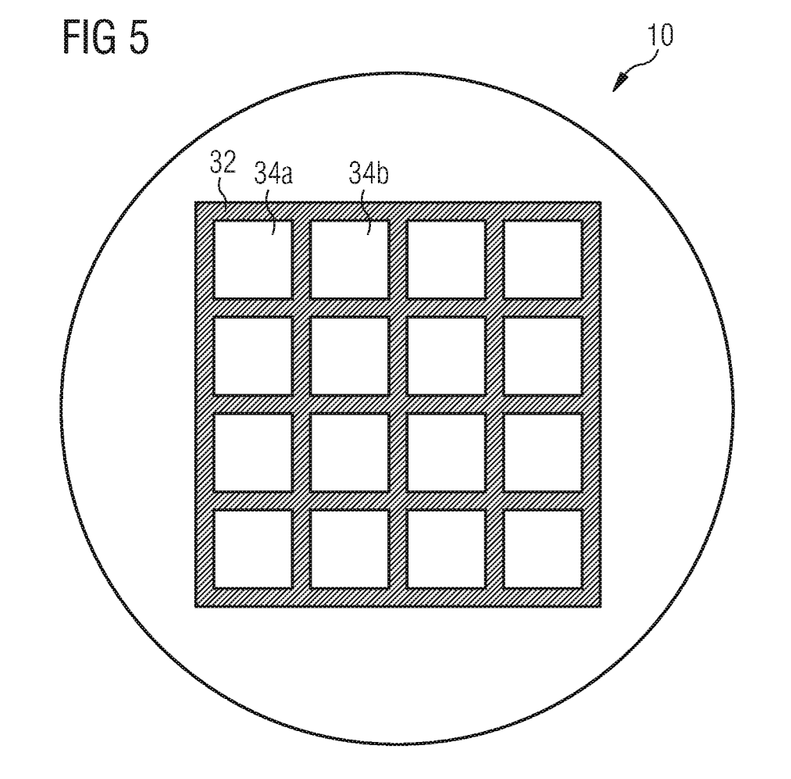
FIG. 5 shows a schematic top view of the processed substrate arrangement being a wafer, according to one or more exemplary embodiments.

FIG. 5 shows a schematic top view of the processed substrate arrangement 10, wherein the processed substrate arrangement 10 is, for example, a wafer. The predetermined breaking line 32 is arranged at the wafer and may define a plurality of die regions 34a-b separated by separation regions comprising the predetermined breaking line 32. The separation regions surround the die regions 34a-b and form a border between them.

Figure 6:
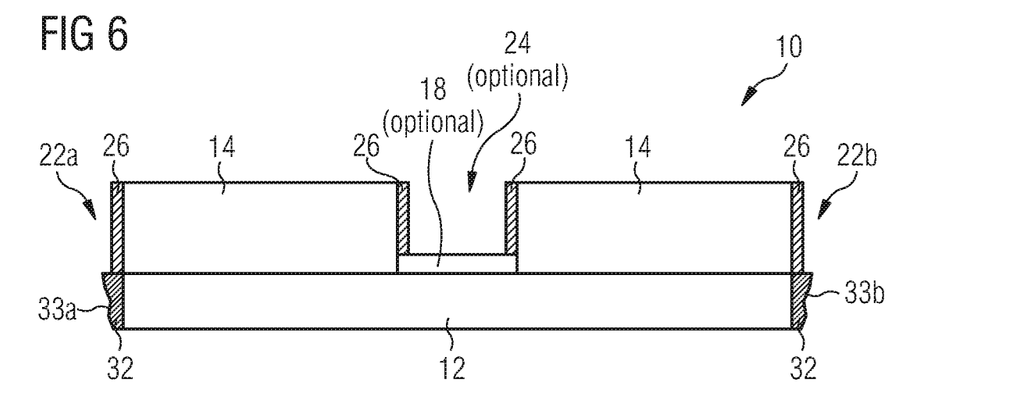
FIG. 6 shows a schematic cross-sectional view of the processed substrate arrangement after a step has been performed, including separating a die region from a second region of the processed substrate arrangement, according to one or more exemplary embodiments.

FIG. 6 shows a schematic cross-sectional view of the processed substrate arrangement 10 after the step 350 has been performed. The passivation layer 26 is arranged at a surface of the metallization layer structure 14 defined (opened) by kerfs 22a and 22b and the notch 24. The protection layer 26 arranged at the metallization layer structure 14 allows for protection and/or insulation of the metallization layer structure 14.

As exemplarily shown in FIG. 6, the passivation layer 26 may be arranged selectively, for example, at side wall structures of the kerf 22 and/or of the optional notch 24, wherein parts of the remaining surface(s) of the processed substrate arrangement may remain uncovered by the passivation layer 26.

Alternatively, the passivation layer 26 may be arranged at additional surfaces, e.g. on the functional element 18, or at almost all or all of the surfaces of the processed substrate arrangement 10 such that the passivation layer is arranged at the kerf 22, at the optional notch 24 and at least partially on other surfaces of the processed substrate arrangement (see for example FIG. 4c).

The processed semiconductor substrate 12 may comprise one or more breaking edges 33a-b in the separation region and in a region in which the kerf was arranged. The breaking edges 33a-b may extend to the passivation layer 26, for example, when the passivation layer 26 is arranged at a bottom of the kerf, as described above. The passivation layer 26 allows for a low or at least controlled spreading of cracks which may occur when breaking the processed semiconductor substrate 12. This may allow for overcoming cracking problems when using stealth dicing processes configured for preparing separation by breaking.

In other words, the separation region may surround the respective die region 34a-b. In the absence of the predefined breaking line 32, the separation region still surrounds and forms a border around the die regions 34a-b.

Figure 7:
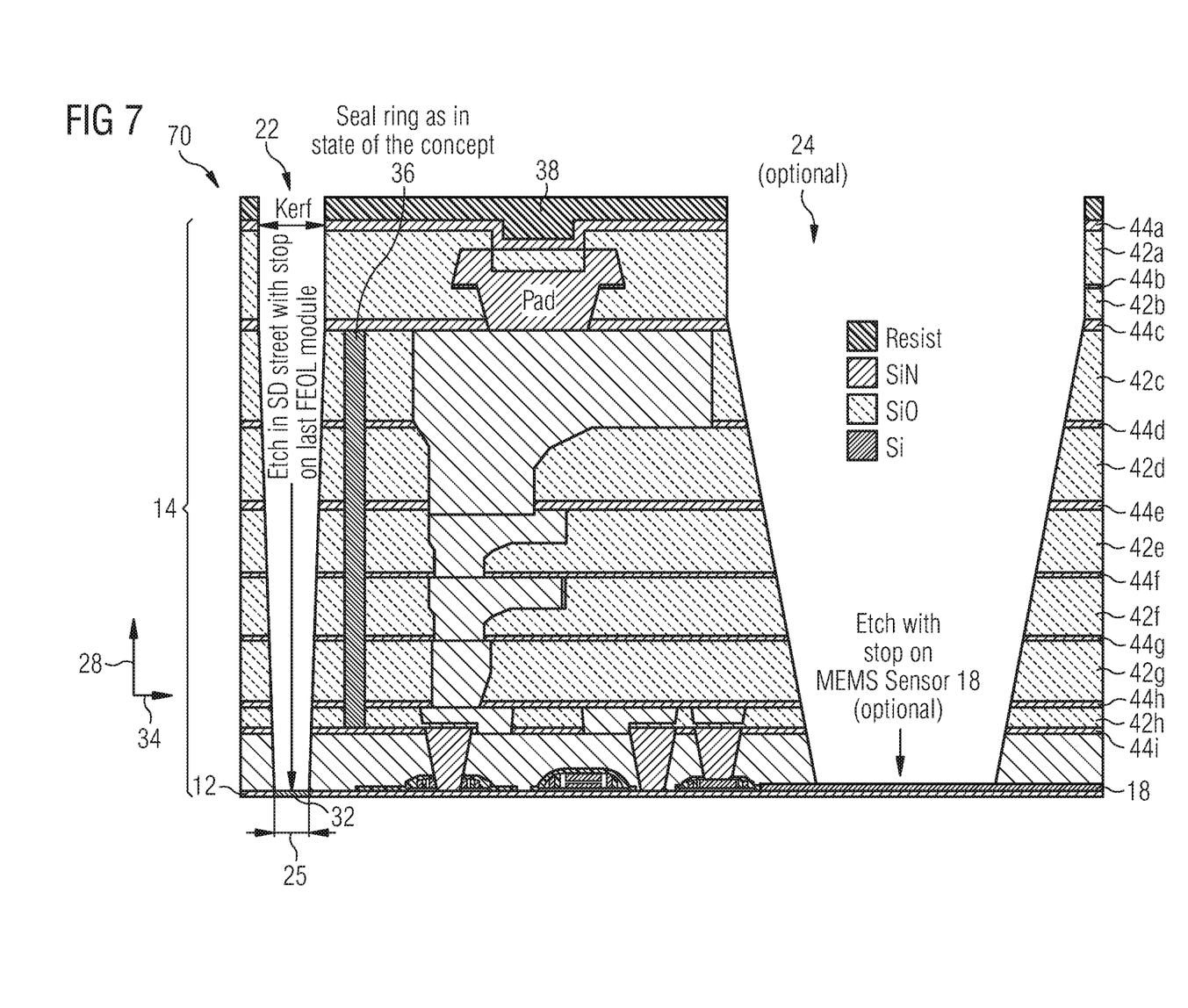
FIG. 7 shows a schematic cross-sectional view of a processed substrate arrangement including the metallization layer structure including a plurality of layers, according to one or more exemplary embodiments.

FIG. 7 shows a schematic cross-sectional view of a processed substrate arrangement 70 comprising the processed semiconductor substrate 12 and the metallization layer structure 14. The kerf 22 is arranged such that it separates the metallization layer structure completely at the separation region 25. The predefined breaking line 32 is arranged at the complete separation region 25 but may alternatively also exceed the separation region 25 or be arranged only partially in the separation region 25.

The kerf 22 and the notch 24 are etched such that they comprise a conical shape, i.e., an extension along a lateral direction 34 perpendicular to the thickness direction 28 may vary along the thickness direction 28. This may also be referred to as the kerf 22 comprising a taper (angle). The taper may comprise an angle value of at least 300, at least 600 or at least 800, such as 84°. For example, the metallization layer structure 14 may comprise a thickness of 5 µm. At the processed semiconductor substrate 12, the kerf 22 may comprise a width (e.g., 16 µm) that is reduced by approximately 500 nm per edge (for example and without limitation: left and right, e.g., to 15 µm) when compared to a width of the kerf 22 at a surface of the metallization layer structure 14 averted from the processed semiconductor substrate 12. The extension along the lateral direction 34 may decrease towards the processed semiconductor substrate 12 but may also increase or remain constant. Thus, exemplarily assuming a taper of 84° and a BEOL height of about 5 µm, the bottom dimension of the kerf 22 is about 500 nm/edge smaller than the top dimension. Thus, assuming a kerf 22 with a top with of 1611m, the kerf has a bottom dimension of about 15 µm.

The processed substrate arrangement 70 may be obtained, for example, by performing one of the steps 120, 210 or 220.

The kerf 22 may be obtained by the release etching, wherein the kerf may define a so-called stealth dicing street, wherein the release etching may stop, for example, on a last FEOL module, i.e., a FEOL layer adjacent to the processed substrate layer 12.

The notch 24 may be etched simultaneously with the kerf 22, wherein the etching process may stop on the functional element 18, for example, a MEMS sensor.

The processed substrate arrangement 70 comprises a seal ring 36, for example, comprising a metal material such as copper extending through one, more or even all of the layers of the metallization layer structure 14. The seal ring 36 is configured for protecting the metallization layer structure 14 arranged between the seal ring 36 and the notch 24 but may suffer, for example, from humidity or an aggressive environment when brought into contact therewith. A contact may be obtained, for example, by cracks resulting from separation by breaking.

Without a passivation at the kerf, the seal ring 36 may corrode as humidity enters the oxide layers and reaches the metal, especially in pre-molded packages. Apart from this obvious reliability issue, the corrosion may additionally cause stress and lead to sensor drifts. This can be avoided by the above described passivation, e.g., using silicon nitride (SiN) which is a proven humidity blocking layer. Simplified, the MEMS release etch is applied both on the MEMS area and the dicing area. The MEMS passivation is applied (on the whole wafer), becoming effective both on the MEMS device and the side-wall of the BEOL (metallization layer structure) at the chip edge. This may be obtained without extra manufacturing costs, without a change of an integration scheme of the obtained semiconductor element, without a chip area penalty while allowing for an improved crack guidance, especially when using stealth dicing, while reducing a dicing street dimension, while obtaining an improved media robustness of the BEOL as the BEOL side-wall is protected by passivation nitride. Further, an improved (reduced) humidity drift may be obtained.

The metallization layer structure 14 may be covered with a resistive layer 38, for example, comprising a polymer material or any other appropriate material. The metallization layer structure 14 may comprise a plurality of insulating layers 42a-h separated from each other by a plurality of layers 44a-i. The notch 24 partially releases the functional element 18. The insulating layers 42a-h may comprise, for example, a silicon oxide material. The layers 44a-i may comprise, for example, a silicon nitride material. The functional element 18 may comprise, for example, a silicon material. The layer structure may comprise less or further layers. The insulating layers may comprise a thickness (extension along the thickness direction) of, for example, at least 1 nm and at most 2000 nm, at least 5 nm and at most 1500 nm or at least 10 nm and at most 1000 nm.

The metallization layer structure further comprises an optional seal ring 36 which may comprise a metal material. The seal ring may surround an area of the functional element 18. Although the seal ring 36 is depicted as being arranged only with respect to some of the layers of the metallization layer structure, the seal ring may also be arranged with respect to other or even all of the layers. The sealing ring may have a thickness between 5 and 20 µm or between 7 and 11 µm and may comprise a thickness of about 9 µm.

In FIG. 7, an indication shows the different materials exemplarily used for the different structures and elements of the processed substrate arrangement 70. This indication is only exemplary, wherein other materials having a comparable functionality may be alternatively used.

Figure 8:
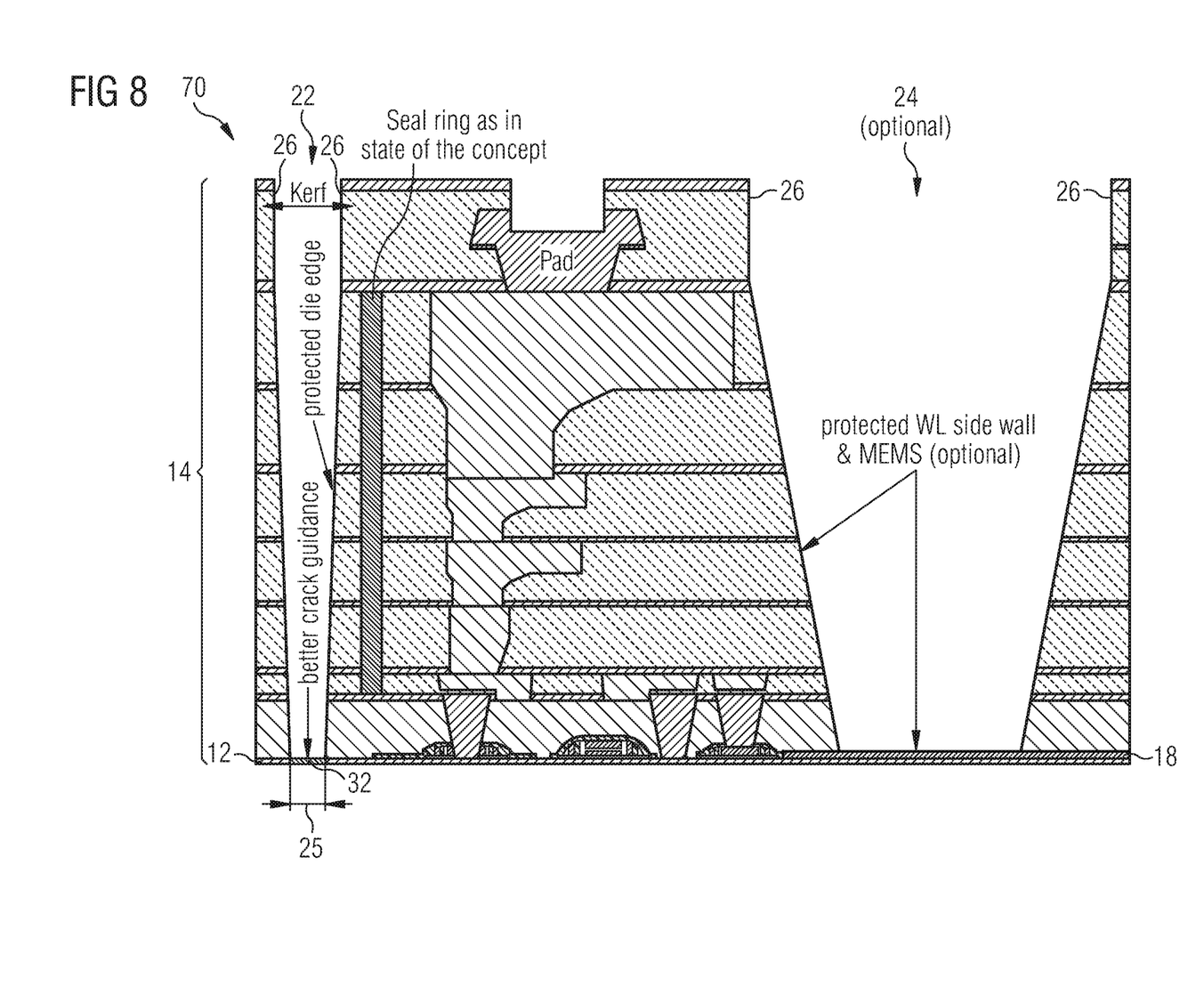
FIG. 8 shows a schematic cross-sectional view of the processed substrate arrangement of FIG. 7 after an insulating layer has been arranged at surfaces of the metallization layer structure, according to one or more exemplary embodiments.

FIG. 8 shows a schematic cross-sectional view of the processed substrate arrangement 70 after the insulating layer 26 has been arranged at surfaces of the metallization layer structure 14 defined by the kerf 22 and the notch 24 and on the functional element 18. This allows for a better crack guidance when breaking the processed semiconductor substrate 12 at the separation region 24 and for a protected die etch defined by the kerf 22. The passivation layer 26 further allows for a protection of the metallization layer 14 at the notch 25 (side wall thereof) and of the functional element 18. Breaking the processed substrate arrangement at the kerf 22 may allow for obtaining a structure according to FIG. 6.

The passivation layer 26 may be arranged (generated) at the kerf 22 and at the notch 24 simultaneously. This allows for a reduced effort in time and/or costs, for example, an additional effort when compared to an arrangement of the insulating layer 26 at the notch 24, an additional effort in time may be zero or almost zero when simultaneously depositing the passivation layer 26 at the kerf 22.

In other words, an integrated pressure sensor may be manufactured using stealth dicing as a separation technique and a thin SiN final passivation layer in the sensor region. Stealth dicing (SD) may be a favorable separation process as it may require only a narrow kerf and may thus save wafer area. Additionally, dicing liquid or debris may be prevented which may contaminate the sensor membrane. Above described embodiments allow for overcoming uncontrolled breaking in BEOL layers which may be a major risk for many technologies as it is sensitive to the FEOL and BEOL stack in the kerf.

Films such as high film-stress high density plasma (HDP) oxides introduced in sensor processes may even enhance SD-caused delamination which may yield severe yield loss. This severe yield loss may be reduced or even eliminated when executing above described embodiments. Above described embodiments also allow for a higher robustness of sensors which may be installed in pressure-sensing applications in harsh environments. In harsh environments standard pads and metal seal rings at chip edges may by insufficient protection, wherein the above described protection by the passivation layer may allow for such applications.

In above described embodiments, a dual use of processes for the etching (for etching the kerf and the notch) and for passivating (the edges of the kerf and of the notch) are described. The MEMS release etch may be used to remove the BEOL-insulating dielectric layer (IDL) stack in the chip separation area (dicing street, separating region) at least partially or even entirely and may thus guide the crack line (or saw in case of conventional sawing) more precisely and may thus avoid uncontrolled cracking. Dicing—independently of the method used—may effectively become separation of the substrate (processed semiconductor substrate) only.

Hence, the dicing street dimension can be reduced which directly translates into a yield win (e.g., more chips per wafer).

Further, the thin MEMS passivation layer that is deposited after the MEMS release etch will have no effect on the chip separation but inherently may seal the outer BEOL stack and thus may improve the media-robustness of the die etch. This may become vital for pressure-sensing application in harsh environments; in particular, if diiodmethane robustness is required and if a standard metal seal ring (copper) may not protect the chip sufficiently.

Uncontrolled cracking when using stealth dicing may be overcome with the above described embodiments. Above described embodiments use a MEMS release etch to remove the IDL in the SD area and thus improve the SD yield. Furthermore, a thin MEMS passivation may also be used to seal the die edge and thus prohibit humidity uptake (absorption) and metal corrosion of the guard ring. Thus, above described embodiments may refer to a combination of MEMS release etch and MEMS passivation for application in MEMS area and dicing street (chip edge) for improved chip separation yield, MEMS quality and chip edge seal. This may also be regarded as a dual use of MEMS release etch and passivation.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative and it is understood that modifications and variations of the arrangements and the details described herein will be apparent to others skilled in the art. It is the intent, therefore, to be limited only by the scope of the impending patent claims and not by the specific details presented by way of description and explanation of the exemplary embodiments herein.

What is claimed is:

1. A semiconductor element comprising:
   a processed substrate arrangement comprising a processed semiconductor substrate and a metallization layer structure on a main surface of the processed semiconductor substrate;
   a passivation layer arranged at an outer border of the processed substrate arrangement;
   a microelectromechanical system (MEMS) functional element arranged at the processed semiconductor substrate; and
   a notch formed in the metallization layer structure,
   wherein the passivation layer is deposited such that the MEMS functional element, arranged at the processed semiconductor substrate in the notch, and side wall structures of the notch in the metallization layer structure are covered by the passivation layer, and
   wherein the metallization layer structure includes a kerf at a separation region in the processed semiconductor substrate, the separation region defining a border between a die region of the processed substrate arrangement and at least a second region of the processed substrate arrangement.

2. The semiconductor element according to claim 1, wherein the MEMS functional element is a MEMS sensor, a MEMS actuator, or a MEMS transducer.

3. The semiconductor element according to claim 1, wherein the MEMS functional element is arranged at the processed semiconductor substrate in the die region.

4. The semiconductor element according to claim 3, wherein the MEMS functional element is released from the metallization layer structure by a notch in the metallization layer structure.

5. The semiconductor element according to claim 4, wherein the passivation layer is arranged at the outer border of the processed substrate arrangement and at a side wall structure of the notch such that at least a portion of the MEMS functional element is exposed.

6. The semiconductor element according to claim 5, wherein the passivation layer is arranged at the outer border of the processed substrate arrangement and at a side wall structure of the kerf such that at least a portion of the main surface of processed substrate arrangement at the kerf is exposed.

7. The semiconductor element according to claim 5, wherein the passivation layer is arranged at the outer border of the processed substrate arrangement, at a side wall structure of the kerf, and at a bottom of the kerf such that the main surface of processed substrate arrangement at the kerf is entirely covered by the passivation layer.

8. The semiconductor element according to claim 1, wherein the passivation layer is arranged at the outer border of the processed substrate arrangement and at a side wall structure of the kerf such that at least a portion of the main surface of processed substrate arrangement at the kerf is exposed.

9. The semiconductor element according to claim claim 1, wherein the passivation layer is arranged at the outer border of the processed substrate arrangement, at a side wall structure of the kerf, and at a bottom of the kerf such that the main surface of processed substrate arrangement at the kerf is entirely covered by the passivation layer.

10. The semiconductor element according to claim 1, wherein the passivation layer comprises an insulator material comprising a silicon nitride material.

11. The semiconductor element according to claim 1, wherein the processed substrate arrangement comprises a breaking edge at the outer border.

12. A semiconductor element, comprising:
    a processed substrate arrangement comprising a processed semiconductor substrate and a metallization layer structure on a main surface of the processed semiconductor substrate;
    a passivation layer arranged at an outer border of the processed substrate arrangement; and
    a microelectromechanical system (MEMS) functional element arranged at the processed semiconductor substrate,
    wherein the metallization layer structure includes a kerf at a separation region in the processed semiconductor substrate, the separation region defining a border between a die region of the processed substrate arrangement and at least a second region of the processed substrate arrangement,
    wherein the MEMS functional element is arranged at the processed semiconductor substrate in the die region,
    wherein the MEMS functional element is released from the metallization layer structure by a notch in the metallization layer structure, and
    wherein the passivation layer is arranged at the outer border of the processed substrate arrangement, at a side wall structure of the notch, and over a surface of the MEMS functional element such that at least a portion of the MEMS functional element is exposed.

13. The semiconductor element according to claim 12, wherein the passivation layer is arranged at the outer border of the processed substrate arrangement and at a side wall structure of the kerf such that at least a portion of the main surface of processed substrate arrangement at the kerf is exposed.

14. The semiconductor element according to claim 12, wherein the passivation layer is arranged at the outer border of the processed substrate arrangement, at a side wall structure of the kerf, and at a bottom of the kerf such that the main surface of processed substrate arrangement at the kerf is entirely covered by the passivation layer.

15. A semiconductor element, comprising
    a processed substrate arrangement comprising a processed semiconductor substrate and a metallization layer structure on a main surface of the processed semiconductor substrate;

a passivation layer arranged at an outer border of the processed substrate arrangement; and a microelectromechanical system (MEMS) functional element arranged at the processed semiconductor substrate, wherein the metallization layer structure includes a kerf at a separation region in the processed semiconductor substrate, the separation region defining a border between a die region of the processed substrate arrangement and at least a second region of the processed substrate arrangement, wherein the MEMS functional element is arranged at the processed semiconductor substrate in the die region, wherein the MEMS functional element is released from the metallization layer structure by a notch in the metallization layer structure, and wherein the passivation layer is arranged at the outer border of the processed substrate arrangement, at a side wall structure of the notch, and over a surface of the MEMS functional element such that the entire surface of the MEMS functional element is covered by the passivation layer.

16. The semiconductor element according to claim 15, wherein the passivation layer is arranged at the outer border of the processed substrate arrangement and at a side wall structure of the kerf such that at least a portion of the main surface of processed substrate arrangement at the kerf is exposed.

17. The semiconductor element according to claim 15, wherein the passivation layer is arranged at the outer border of the processed substrate arrangement, at a side wall structure of the kerf, and at a bottom of the kerf such that the main surface of processed substrate arrangement at the kerf is entirely covered by the passivation layer.

* * * * *